(12) United States Patent
Sharma et al.

(10) Patent No.: US 10,944,361 B2
(45) Date of Patent: Mar. 9, 2021

(54) ZERO IF TRANSMITTER WITH DECOUPLING BETWEEN MIXER AND PROGRAMMABLE GAIN STAGE

(71) Applicant: TEXAS INSTRUMENTS INCORPORATED, Dallas, TX (US)

(72) Inventors: Rahul Sharma, Bengaluru (IN); Jagannathan Venkataraman, Bengaluru (IN); Eeshan Miglani, Chhindwara (IN); Sandeep Kesrimal Oswal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/274,519

(22) Filed: Feb. 13, 2019

(65) Prior Publication Data

US 2020/0177130 A1 Jun. 4, 2020

Related U.S. Application Data

(60) Provisional application No. 62/786,041, filed on Dec. 28, 2018.

(30) Foreign Application Priority Data

Nov. 30, 2018 (IN) .............................. 201841045313

(51) Int. Cl.
| | | |
|---|---|---|
| H03C 1/06 | (2006.01) | |
| H04B 1/04 | (2006.01) | |
| H03C 1/60 | (2006.01) | |

(52) U.S. Cl.
CPC ................. *H03C 1/06* (2013.01); *H03C 1/60* (2013.01); *H04B 1/0475* (2013.01)

(58) Field of Classification Search
CPC ........... H03C 1/06; H03C 1/60; H04B 1/0475
See application file for complete search history.

(56) References Cited

U.S. PATENT DOCUMENTS

| | | | |
|---|---|---|---|
| 2007/0014382 A1* | 1/2007 | Shakeshaft | ........... H03F 1/0233 375/297 |
| 2007/0142000 A1* | 6/2007 | Herzinger | ................ H04B 1/04 455/91 |
| 2010/0080270 A1* | 4/2010 | Chen | ....................... H03F 1/223 375/219 |

* cited by examiner

*Primary Examiner* — Jeffrey M Shin
(74) *Attorney, Agent, or Firm* — John R. Pessetto; Charles A. Brill; Frank D. Cimino

(57) ABSTRACT

A system includes a Zero IF transmitter having a mixer and a programmable gain stage. The Zero IF transmitter also includes an intermediate stage between the mixer and the programmable gain stage, wherein the intermediate stage is configured to decouple the mixer and the programmable gain stage.

13 Claims, 3 Drawing Sheets

ZERO IF TRANSMITTER WITH DECOUPLING BETWEEN MIXER AND PROGRAMMABLE GAIN STAGE

CROSS-REFERENCE TO RELATED APPLICATIONS

This application claims priority to India Provisional Application No. 201841045313 filed Nov. 30, 2018, titled "Power Efficient Low Voltage Low Noise Enhanced Linearity Transmit Architecture with Low Single Sideband Image," and U.S. Provisional Application No. 62/786,041 filed Dec. 28, 2018, titled "Zero IF Transmitter with Decoupling Between Mixer and Programmable Gain Stage," which are hereby incorporated herein in their entirety.

BACKGROUND

A minimal cost of implementation is an important criterion for a viable base-station transceiver design. Two base-station transceiver architecture options include a multistage architecture and a single-stage architecture. Multistage architectures are more power and area intensive, whereas single-stage (Zero IF) architectures are more efficient in these respects. In a Zero IF architecture, the goal is a direct up-conversion architecture that eliminates the need for IF stages (e.g., an I-Q quadrature modulator takes the baseband (or low IF) input signal and up-converts it directly to the desired RF frequency). In an example Zero IF transmitter architecture, an I-Q mixer s coupled to a programmable gain stage. With this example Zero IF architecture, noise is an issue and/or high-speed level shifters are used, which increases power consumption. In addition, I-Q mismatch and local oscillator (LO) leakage could be gain dependent.

SUMMARY

In accordance with at least some examples of the disclosure, a system comprises a Zero IF transmitter having a mixer and a programmable gain stage. The Zero IF transmitter also comprises an intermediate stage between the mixer and the programmable gain stage, wherein the intermediate stage is configured to decouple the mixer and the programmable gain stage.

In accordance with at least some examples of the disclosure, a Zero IF transmitter circuit comprises a mixer and an intermediate stage coupled to an output of the mixer. The Zero IF transmitter circuit also comprises a programmable gain stage coupled to an output of the intermediate stage, wherein the intermediate stage comprises a decoupling circuit.

In accordance with at least some examples of the disclosure, a Zero IF transmitter circuit comprises a mixer and an intermediate stage coupled to an output of the mixer. The Zero IF transmitter circuit also comprises a programmable gain stage coupled to an output of the intermediate stage. The intermediate stage comprises a decoupling circuit having a first transistor and a second transistor. A first current terminal of the first transistor is coupled to the programmable gain stage. A second current terminal of the first transistor is coupled to a first mixer output node. A control terminal of the first transistor is coupled to the second current terminal of the second transistor via a first capacitor. A first current terminal of the second transistor is coupled to the programmable gain stage. A second current terminal of the second transistor is coupled to a second mixer output node. A control terminal of the second transistor is coupled to the second current terminal of the first transistor via a second capacitor.

BRIEF DESCRIPTION OF THE DRAWINGS

For a detailed description of various examples, reference will now be made to the accompanying drawings in which.

DETAILED DESCRIPTION

Disclosed herein are Zero IF transmitter topologies with a mixer, a programmable gain stage, and an intermediate stage to decouple the mixer from the programmable gain stage. In some examples, the intermediate stage comprises a decoupling circuit with a common gate structure. In some examples, the decoupling circuit includes a first transistor and second transistor. A first current terminal of the first transistor is coupled to the programmable gain stage. A second current terminal of the first transistor is coupled to a first mixer output node. A control terminal of the first transistor is coupled to the second current terminal of the second transistor via a first capacitor. A first current terminal of the second transistor is coupled to the programmable gain stage. A second current terminal of the second transistor is coupled to a second mixer output node. A control terminal of the second transistor is coupled to the second current terminal of the first transistor via a second capacitor.

In an example Zero IF transmitter, I-phase and Q-phase digital-to-analog converters (DACs) are connected to the decoupling circuit, which presents a low impedance to the DACs. With a low impedance at the output of the DACs, the output swing of the DACs is low which enables the DACs to operate without high speed level shifters. Also, DAC and mixer linearity is improved. By using different common gate structures at the output of the I-phase and Q-phase DACs, I-phase and Q-phase coupling is reduced and single-sideband (SSB) image is improved. In addition, the local oscillator (LO) leakage is independent of the programmable gain setting. In some examples, the intermediate stage also includes inductors coupled to the decoupling circuit to help reduce noise resulting from the intermediate state.

The disclosed Zero IF transmitter topologies are different from other Zero IF transmitter topologies because the swing at the output of the DACs is reduced without a feedback amplifier. Also, the disclosed Zero IF transmitter topologies provide good linearity with low noise and low power consumption. Also, the disclosed Zero IF transmitter topologies make I-Q image independent of transmitter gain setting. To provide a better understanding, various Zero IF transmitter system and transmitter options are described using the figures as follows.

Figure 1:
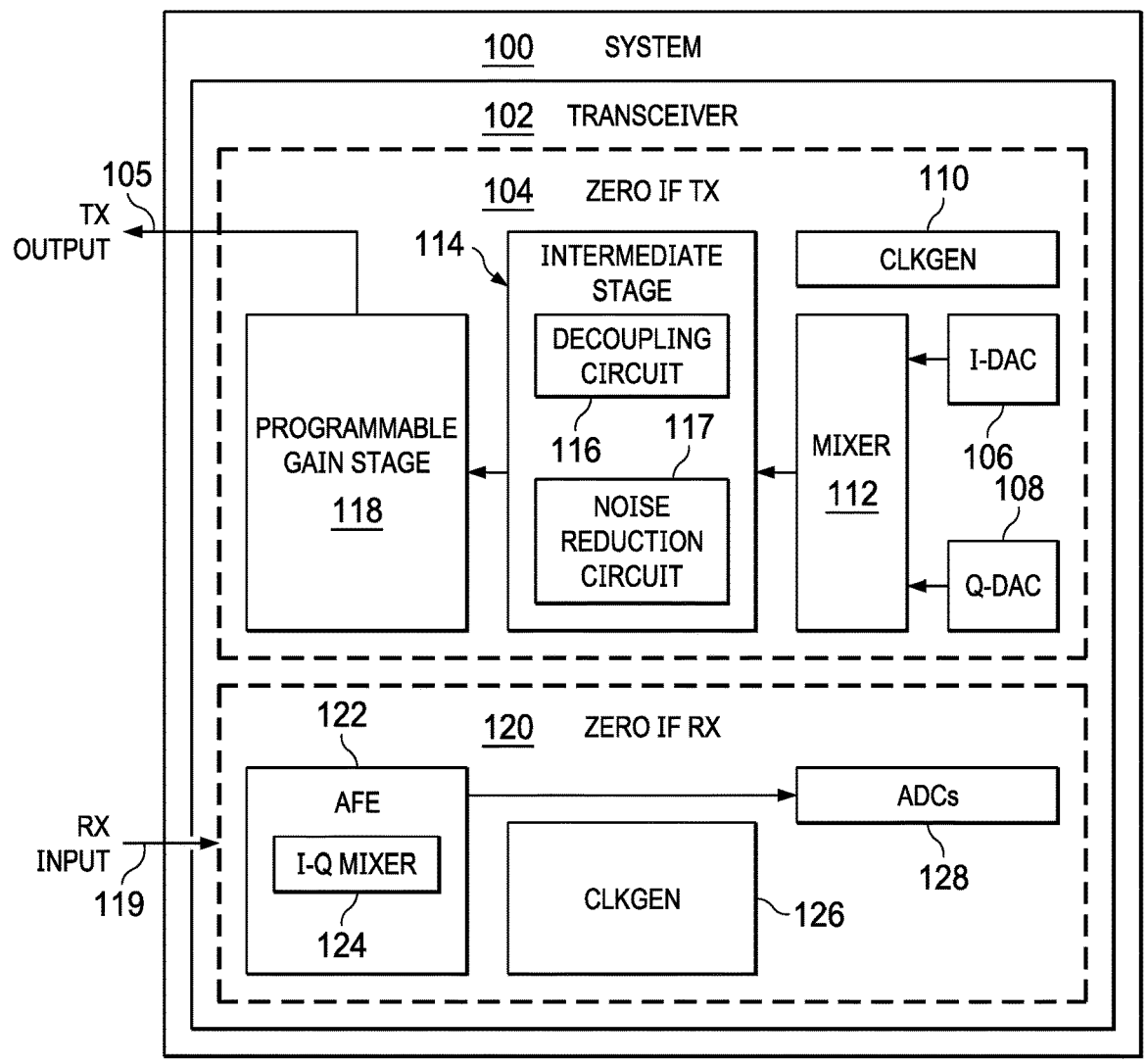
FIG. 1 is a block diagram showing a system in accordance with some examples.

FIG. 1 is a block diagram showing a system 100 in accordance with some examples. In different examples, the system 100 corresponds to a base-station, a consumer device, and/or another device configured to perform data transmit and data receive operations using a transceiver 102. More specifically, the transceiver 102 includes a Zero IF transmitter 104 and a Zero IF receiver 120. For the Zero IF transmitter 104, transmit operations are performed by converting a baseline frequency to an RF frequency without using intermediate frequencies. Meanwhile for the Zero IF receiver 120, transmit operations are performed by converting an RF frequency to a baseline frequency without using intermediate frequencies.

In FIG. 1, the Zero IF receiver 120 receives an input RF signal 119. As shown, the Zero IF receiver 120 includes an analog front-end (AFE) 122 with an I-Q mixer 124. The AFE 122 is configured to perform operations such as filtering, amplification, and I-Q mixing. The output from the AFE 122 is provided to analog-to-digital converters (ADCs) 128, where the digitized outputs from the ADCs 128 are conveyed to other components for processing (e.g., decoding and storage) and/or other operations. In FIG. 1, the Zero IF transmitter 104 also includes a clock generator 110 configured to provide a baseband clock and an RF clock for components of the Zero IF receiver 120. In one example, the I-Q mixer 124 uses an RF clock, and the ADCs 128 use a baseband clock.

As shown in FIG. 1, the Zero IF transmitter 104 includes a mixer 112, a programmable gain stage 118, and an intermediate stage 114 between the mixer 112 and the programmable gain stage 118. As shown, the intermediate stage 114 includes a decoupling circuit 116 and a noise reduction circuit 117, which reduces the noise injected by intermediate stage 114. In some examples, the decoupling circuit 116 has a common gate structure, and the noise reduction circuit 117 includes inductors. The Zero IF transmitter 104 also includes an I-phase DAC 106 and a Q-phase DAC 108 configured to provide inputs to the mixer 112. The Zero IF transmitter 104 also includes a clock generator 110 configured to provide a baseband clock and an RF clock for components of the Zero IF transmitter 104. In one example, the mixer 112 uses an RF clock, and the phase DAC 106 and a Q-phase DAC 108 use baseband clock. The output from the Zero IF transmitter 104 is an output RF signal 105.

Figure 2:
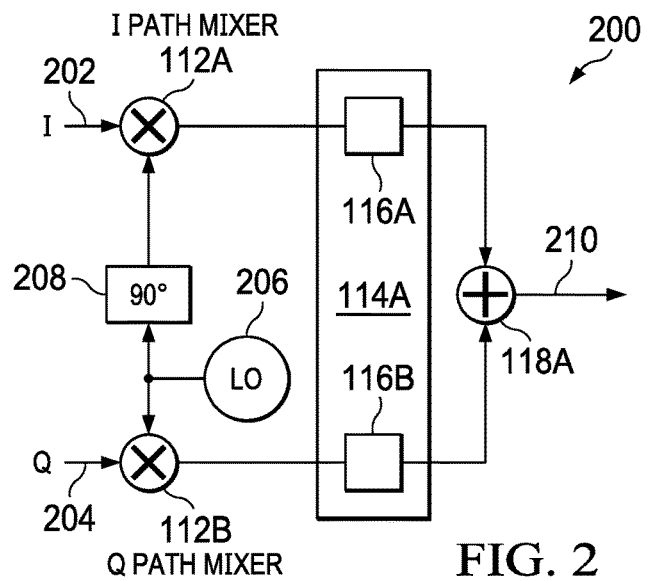
FIG. 2 is a circuit diagram showing a Zero IF transmitter in accordance with some examples.

FIG. 2 is a circuit diagram showing a Zero IF transmitter 200 in accordance with some examples. In some examples, the Zero IF transmitter 200 is an example of the Zero IF transmitter 104 in FIG. 1. As shown, the Zero IF transmitter 200 includes an I-phase path mixer 112A and a Q-phase path mixer 112B (components of the mixer 112 in FIG. 1). In some examples, the input signal 202 to the I-phase path mixer 112A is the output from a I-phase DAC, such as the I-phase DAC 106 in FIG. 1. Also, the input signal 204 to the Q-phase path mixer 112B is the output from a Q-phase DAC, such as the Q-phase DAC 108 in FIG. 1.

In the example of FIG. 2, a local oscillator (LO) 206 provides a clock signal, where the clock signal from the LO 206 is used for the Q-phase path mixer 112B. As represented in FIG. 2, the phase for the clock signal used for the I-phase path mixer 112A is shifted by 90 degrees (using block 208) relative to the phase of the clock signal for the Q-phase path mixer 112B. The outputs from the I-phase path mixer 112A and a Q-phase path mixer 112B are provided to an intermediate stage 114A (an example of the intermediate stage 114 in FIG. 1), where the intermediate stage 114A decouples the I-phase path mixer 112A and a Q-phase path mixer 112B from a summing amplifier 118A (an example of the programmable gain stage 118 in FIG. 1). In FIG. 2, the intermediate state 114A includes a first decoupling circuit 116A and a second decoupling circuit 116B, where the first decoupling circuit 116A is for the output of the I-phase path mixer 112A and the second decoupling circuit 116B is for the output of the Q-phase path mixer 112B. In some examples, each of the first and second decoupling circuit 116A and 116B has common gate structure.

An example common gate structure for either of the first and second decoupling circuit 116A and 116B includes a first transistor and second transistor. A first current terminal of the first transistor is coupled to the programmable gain stage. A second current terminal of the first transistor is coupled to a first mixer output node. A control terminal of the first transistor is coupled to the second current terminal of the second transistor via a first capacitor. A first current terminal of the second transistor is coupled to the programmable gain stage. A second current terminal of the second transistor is coupled to a second mixer output node. A control terminal of the second transistor is coupled to the second current terminal of the first transistor via a second capacitor. As represented in FIG. 2, the outputs from the first decoupling circuit 116A and the second decoupling circuit 116B are provided to the summing amplifier 118A, which performs a programmable amplification to provide an output signal 210.

Figure 3:
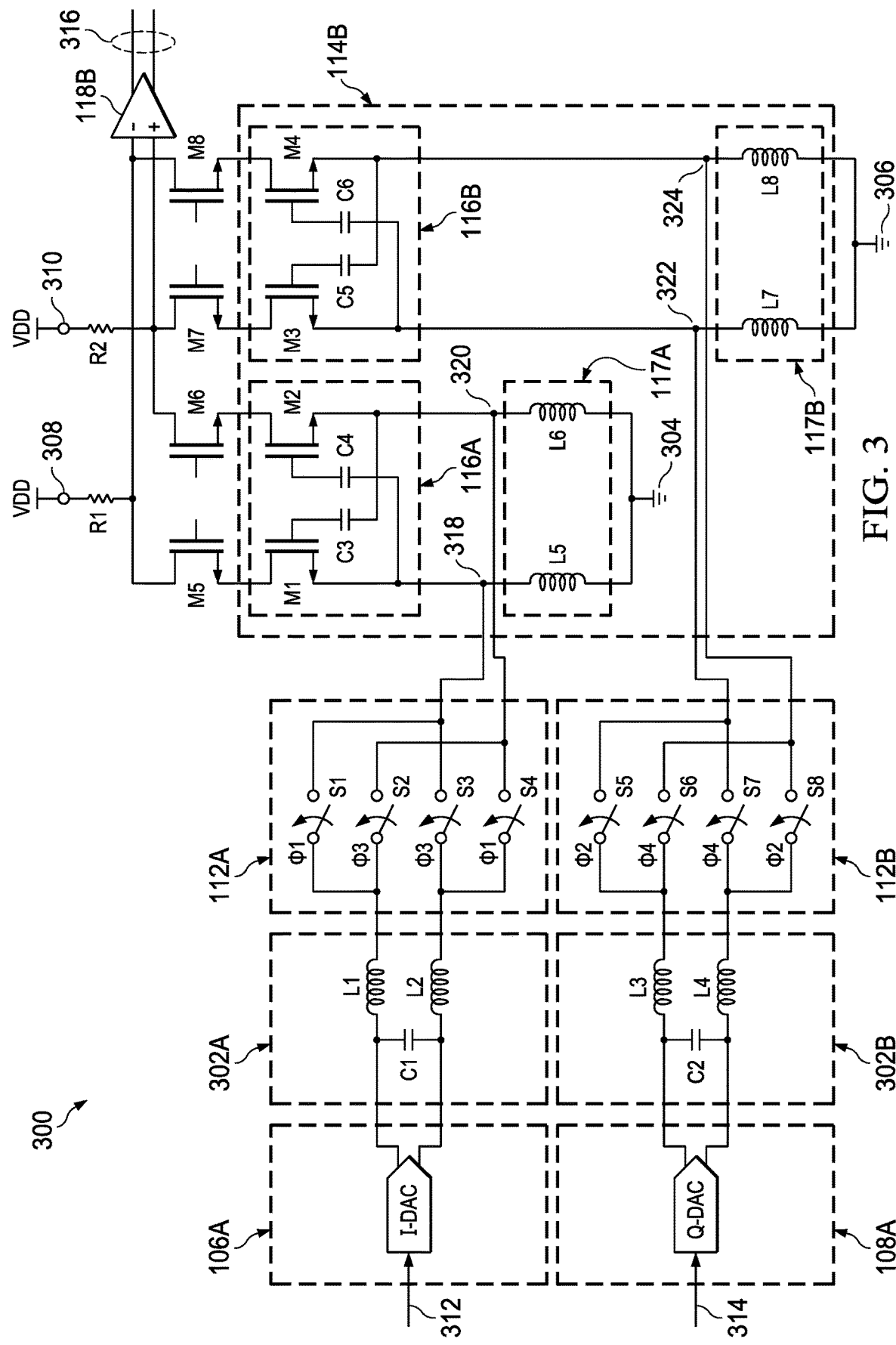
FIG. 3 is a schematic diagram showing a Zero IF transmitter in accordance with some examples.

FIG. 3 is a schematic diagram showing a Zero IF transmitter 300 in accordance with some examples. In the Zero IF transmitter 300, an intermediate stage 114B in used between mixers, I-phase mixer 112A and Q-phase mixer 112B, and a programmable gain stage 118B. In operation, the intermediate stage 114B decouples the mixers, I-phase mixer 112A and Q-phase mixer 112B, from the programmable gain stage 118B. In FIG. 3, the programmable gain stage 118B is an example of the programmable gain stage 118 in FIG. 1, or the summing amplifier 118A in FIG. 2. Also, the intermediate gain stage 114B in FIG. 3 is an example of the intermediate gain stage 114 in FIG. 1, or the intermediate gain stage 114A in FIG. 2. In the example, of FIG. 3, the inputs of the programmable gain stage 118B are coupled to voltage supply nodes 308 and 310 via resistors, R1 and R2. In some examples, the output of the programmable gain stage 118B is a differential signal 316.

As shown, the Zero IF transmitter 300 includes an I-phase DAC 106A and a Q-phase DAC 106B, where the input signal 312 to the I-phase DAC 106A is a I-phase signal and the input signal 314 to the Q-phase DAC 106B is a Q-phase signal. In the example of FIG. 3, the output of the I-phase DAC 106A is a differential signal that is received by an image reject filter circuit 302A configured to select only a desired frequency ("fout") and reject other images. More specifically, the output from the I-phase DAC 106A includes a desired frequency ("fout") as well as all the images of fout (N*Fs+/−fout), where N is any integer and Fs is DAC clock. Accordingly, the image reject filter circuit 302A selects only fout and rejects other images. As shown, the image reject filter circuit 302A includes two inductors, L1 and L2, in series along each of two signal paths from the I-phase DAC 106A. Also, for the image reject filter circuit 302A, a capacitor (C1) extends between the two signal paths. The signals output from image reject filter circuit 302A are provided to an I-phase path mixer 112A. As shown, the I-phase path mixer 112A comprises four switches, S1-S4, directed by control signals φ1 and φ3. More specifically, S1 is directed to by φ1, S2 is directed to by φ3, S3 is directed to by φ3, and S4 is directed to by φ4. Also, the output of S1 is mixed with the output of S3, while the output of S2 is mixed with the output of S4.

In FIG. 3, the outputs from the I-phase path mixer 112A are conveyed to a decoupling circuit 116A and to a noise reduction circuit 117A of the intermediate stage 114B. As shown, the decoupling circuit 116A includes two transistors, M1 and M2. The first current terminal of M1 is coupled to the programmable gain stage 118B via a transistor, M5. Meanwhile, the second current terminal of M1 is coupled to a first mixer output node 318. A control terminal of M1 is coupled to the second current terminal of M2 via a capacitor (C3). Also, a first current terminal of M2 is coupled to the programmable gain stage 118B via a transistor, M6. A second current terminal of M2 is coupled to a second mixer output node 320. Also, a control terminal of M2 is coupled to the second current terminal of M1 via a capacitor (C4). The arrangement given in FIG. 3 for the decoupling circuit 116A is an example of a common gate structure.

In the example of FIG. 3, the noise reduction circuit 117A comprises inductors, L5 and L6. More specifically, L5 is between the first mixer output node 318 and a ground node 304. Also, L6 is between the second mixer output node 320 and the ground node 304. This reduces the noise compared to the case where common gate stage will be biased using current sources.

In the example of FIG. 3, the output of the Q-phase DAC 106B is a differential signal that is received by an image reject filter circuit 302B configured to select only a desired frequency ("fout") and reject other images. More specifically, the output from the Q-phase DAC 1066 includes a desired frequency ("fout") as well as all the images of fout (N*Fs+/−fout), where N is any integer and Fs is DAC clock. Accordingly, the image reject filter circuit 302B selects only fout and rejects other images. As shown, the image reject filter circuit 302B includes two inductors, L3 and L4, in series along each of two signal paths from the Q-phase DAC 1066. Also, a capacitor (C2) extends between the two signal paths. The signals output from image reject filter circuit 302B are provided to a Q-phase path mixer 112B. As shown, the Q-phase path mixer 112B comprises four switches, S5-S8, directed by control signals φ2 and φ4. More specifically, S5 is directed to by φ2, S6 is directed to by φ4, S7 is directed to by φ4, and S8 is directed to by φ2. Also, the output of S5 is mixed with the output of S7, while the output of S6 is mixed with the output of S8.

In FIG. 3, the outputs from the Q-phase path mixer 112B are conveyed to a decoupling circuit 116A and to a noise reduction circuit 117A of the intermediate stage 114B. As shown, the decoupling circuit 116B includes two transistors, M3 and M4. The first current terminal of M3 is coupled to the programmable gain stage 118B via a transistor, M7. Meanwhile, the second current terminal of M3 is coupled to a third mixer output node 322. A control terminal of M3 is coupled to the second current terminal of M4 via a capacitor (C5). Also, a first current terminal of M4 is coupled to the programmable gain stage 118B via a transistor, M8. A second current terminal of M4 is coupled to a fourth mixer output node 324. Also, a control terminal of M4 is coupled to the second current terminal of M3 via a capacitor (C6). The arrangement given in FIG. 3 for the decoupling circuit 116B is an example of a common gate structure.

In the example of FIG. 3, the noise reduction circuit 117B comprises inductors, L7 and L8. More specifically, L7 is between the third mixer output node 322 and a ground node 306. Also, L8 is between the fourth mixer output node 324 and the ground node 306.

Figure 4:
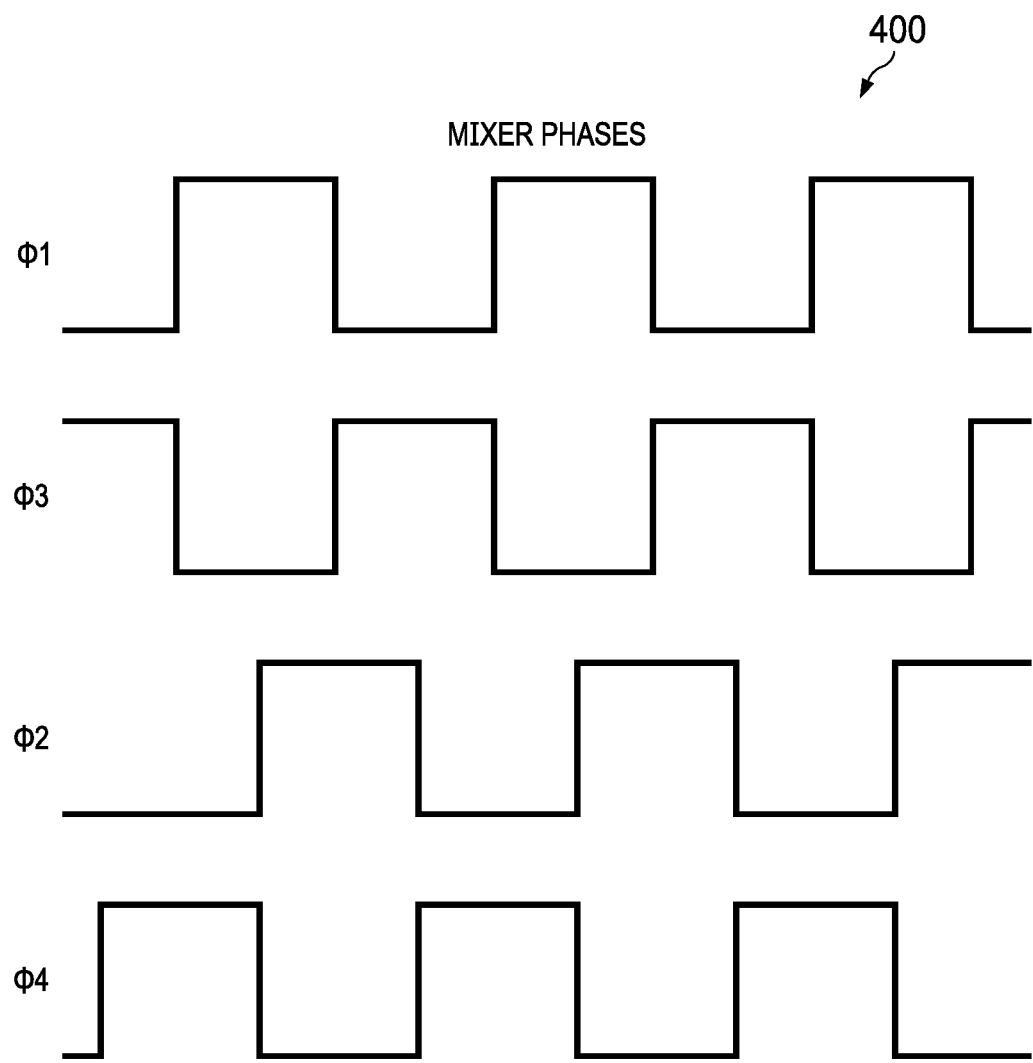
FIG. 4 is a timing diagram showing mixer phases for the Zero IF transmitter of FIG. 3 in accordance with some examples.

In operation, the outputs from the I-phase path mixer 112A and the outputs from the Q-phase path mixer 1126 are based on the phases for φ1-φ4. FIG. 4 is a timing diagram 400 showing mixer phases, φ1-φ4, for the Zero IF transmitter of FIG. 3 in accordance with some examples. As shown, φ3 is in the inverse of φ1. Meanwhile, φ4 is the inverse of φ2. Also, φ2 and φ4 are shifted 90 degrees relative to φ1 and φ3.

As described herein, in some examples, a system (e.g., the system 100 in FIG. 1) comprises a Zero IF transmitter (e.g., the Zero IF transmitter 104 in FIG. 1, the Zero IF transmitter 200 in FIG. 2, or the Zero IF transmitter 300 in FIG. 3). A system may also include other components as described in FIG. 1. The Zero IF transmitter includes a mixer (e.g., the mixer 112 in FIG. 1, the I-phase and Q-phase path mixers 112A and 112B in FIGS. 2 and 3) and a programmable gain stage (e.g., the programmable gain stage 118 in FIG. 1, the summing amplifier 118A in FIG. 2, or the programmable gain stage 118B in FIG. 3). The Zero IF transmitter also includes an intermediate stage (e.g., the intermediate stage 114 in FIG. 1, the intermediate stage 114A in FIG. 2, or the intermediate stage 114B in FIG. 3), where the intermediate gain stage is between the mixer and the programmable gain stage, wherein the intermediate stage is configured to decouple the mixer and the programmable gain stage. In some examples, a Zero IF transmitter also comprises an I-phase DAC (e.g., the I-phase DAC (e.g., the I-phase DAC 106 in FIG. 1, or the I-phase DAC 106A in FIG. 3) and a Q-phase DAC (e.g., the Q-phase DAC 108 in FIG. 1, or the I-phase DAC 108A in FIG. 3) configured to provide differential inputs to the mixer for a Zero IF transmitter.

Because the decoupling circuit for an intermediate stage introduces noise, at least some intermediate stage examples includes a noise reduction circuit (e.g., the noise reduction circuit 117 in FIG. 1, or the noise reduction circuits 117A and 117B in FIG. 3) coupled to the mixer output nodes (e.g., the mixer output nodes 318, 320, 322, 324 in FIG. 3). In some examples, the noise reduction circuit comprises passive components. Specifically, in one example, the passive components include an inductor for each mixer output node, wherein each inductor is coupled between a decoupling circuit and a ground node. As described herein, in some examples, the intermediate stage comprises a first decoupling circuit with a common gate structure and a second decoupling circuit with a common gate structure (see e.g., FIG. 3).

In one example, a first decoupling circuit (e.g., the first decoupling circuit 116A in FIG. 3) is coupled to a first set of mixer output nodes (e.g., the first and second mixer output nodes 318 and 320 in FIG. 3). Also, a second decoupling circuit (e.g., the second decoupling circuit 116B in FIG. 3) is coupled to a second set of mixer output nodes (e.g., the third and fourth mixer output nodes 322 and 324 in FIG. 3).

Also, in some examples, a first decoupling circuit for an intermediate stage includes a first transistor and a second transistor (e.g., M1 and M2 in FIG. 3), where a first current terminal of the first transistor (e.g., M1) is coupled to the programmable gain stage, wherein a second current terminal of the first transistor (e.g., M1) is coupled to a first mixer output node (e.g., the mixer output node 320), and wherein a control terminal of the first transistor (e.g., M1) is coupled to the second current terminal of the second transistor (e.g., M2) via a first capacitor (e.g., C3 in FIG. 3). Also, a first current terminal of the second transistor (e.g., M2) is coupled to the programmable gain stage, wherein a second current terminal of the second transistor (e.g., M2) is coupled to a second mixer output node (e.g., the mixer output node 318), and wherein a control terminal of the second transistor (e.g., M2) is coupled to the second current terminal of the first transistor (e.g., M1) via a second capacitor (e.g., C4 in FIG. 3).

In some examples, a second decoupling circuit for an intermediate stage includes a third transistor and a fourth transistor (e.g., M3 and M4 in FIG. 3), where a first current terminal of the third transistor (e.g., M3) is coupled to the programmable gain stage, wherein a second current terminal of the third transistor (e.g., M3) is coupled to a third mixer output node (e.g., the mixer output node 324), and wherein a control terminal of the third transistor (e.g., M3) is coupled to the second current terminal of the fourth transistor (e.g., M4) via a third capacitor (e.g., C5 in FIG. 3). Also, a first current terminal of the fourth transistor (e.g., M4) is coupled to the programmable gain stage, where a second current terminal of the fourth transistor (e.g., M4) is coupled to a fourth mixer output node (e.g., the mixer output node 322). Also, a control terminal of the fourth transistor (e.g., M4) is coupled to the second current terminal of the third transistor (e.g., M3) via a fourth capacitor (e.g., C6 in FIG. 3). In operation, the intermediate stage is configured to prevent dependency of I-Q mismatch and local oscillator leakage on the programmable gain stage. Also, the intermediate stage is configured to reduce signal swing from the mixer to below a threshold.

With the proposed Zero IF transmitter topologies, I-Q mismatch and LO leakage are independent of programmable gain due to the intermediate stage (e.g., the intermediate stage 114 in FIG. 1, the intermediate stage 114A in FIG. 2, or the intermediate stage 114B in FIG. 3). In at least some examples, the intermediate stage presents a low impedance to each DAC (e.g., the I-phase and Q-phase DACs 106A and 106B in FIG. 3), which improves DAC and mixer nonlinearity. Also, the intermediate stage is designed so that noise and nonlinearity of the intermediate stage is below a threshold. Also, at the output of the intermediate stage, a high signal swing should be present to reduce the noise contribution from the programmable gain stage.

In some examples, each DAC of a Zero IF transmitter (e.g., Zero IF transmitter 104 in FIG. 1, the Zero IF transmitter 200 in FIG. 2, or the Zero IF transmitter 300 in FIG. 3) runs on a 1.8V supply. Also, DAC switches are made using core transistors that switch between 0V and 0.9V to reduce nonlinearity and power consumption. In some examples, an image rejection filter is used to suppress DAC images to a 50 dBc level. As described herein, a decoupling circuit with a common gate stage can be added between a DAC and a programmable gain stage, where use of the common gate stage reduces the swing at the DAC output and improve DAC linearity. In some examples, the common gate transistors (e.g., M1 and M2 in FIG. 3) are cross-coupled to double the effective gm and further reduce the swing. Use of a decoupling circuit as described herein also ensures that the mixer has less swing and is linear. Instead of using a current source to bias a common gate structures for the decoupling circuit (which can be noisy), degeneration inductors are used (e.g., in the noise reduction circuit 117 in FIG. 1, or in the noise reduction circuits 117A and 117B in FIG. 3). With such inductors, the amount of noise is small.

Also, in some examples, different decoupling circuits (e.g., the decoupling circuits 116A and 116B in FIGS. 2 and 3) are used for I-phase and Q-phase paths to remove I-phase and Q-phase cross-talk, which improves single-sideband (SSB) image. Also, the decoupling circuits remove SSB image dependency on the programmable gain stage. In some examples, mixer common mode can be trimmed for both I-phase and Q-phase mixers separately. Also, common gate stage bias may be trimmed separately for I-phase and Q-phase paths to improve SSB image. With the disclosed Zero IF transmitter topologies, less power is consumed compared to other Zero IF transmitter topologies. Also, DAC switches are able to be run without level shifters or use of an external negative voltage supply.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ." The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
a Zero IF transmitter having:
a mixer having inputs and outputs;
an intermediate stage having inputs and an output, wherein the inputs of the intermediate stage are coupled to the outputs of the mixer; and
a programmable gain stage having an input and an output wherein the input of the programammble gain stage is coupled to the output of the intermediate stage;
wherein the intermediate stage comprises a noise reduction circuit coupled to the intermediate stage inputs;
wherein the noise reduction circuit comprises passive components; and
wherein the passive components include an inductor for each intermediate stage input wherein each inductor is coupled between a decoupling circuit and a ground node.

2. A system, comprising:
a Zero IF transmitter having:
a mixer having inputs and outputs;
an intermediate stage having inputs and an output, wherein the inputs of the intermediate stage are coupled to the outputs of the mixer; and
a programmable gain stage having an input and an output wherein the input of the programmable gain stage is coupled to the output of the intermediate stage;
wherein the intermediate stage comprises a first decoupling circuit with a common gate structure and a second decoupling circuit with a common gate structure.

3. A system, comprising:
a Zero IF transmitter having:
a mixer having inputs and outputs;
an intermediate stage having inputs and an output, wherein the inputs of the intermediate stage are coupled to the outputs of the mixer; and
a programmable gain stage having an input and an output wherein the input of the programmable gain stage is coupled to the output of the intermediate stage;
wherein the intermediate stage comprises:
a first decoupling circuit coupled to a first set of intermediate stage inputs; and
a second decoupling circuit coupled to a second set of intermediate stage inputs.

4. The system of claim 3, wherein the first decoupling circuit comprises:
a first transistor; and a second transistor, wherein a first current terminal of the first transistor is coupled to the output of the intermediate stage, wherein a second current terminal of the first transistor is coupled to a first mixer output, and wherein a control terminal of the first transistor is coupled to the second current terminal of the second transistor via a first capacitor, and wherein a first current terminal of the second transistor is coupled to the output of the intermediate stage, wherein a second current terminal of the second transistor is coupled to a second mixer output, and wherein a control terminal of the second transistor is coupled to the second current terminal of the first transistor via a second capacitor.

5. The system of claim 4, wherein the second decoupling circuit comprises:
a third transistor; and
a fourth transistor, wherein a first current terminal of the third transistor is coupled to the output of the intermediate stage, wherein a second current terminal of the third transistor is coupled to a third mixer output, and wherein a control terminal of the third transistor is coupled to the second current terminal of the fourth transistor via a third capacitor, and wherein a first current terminal of the fourth transistor is coupled to the output of the intermediate stage, wherein a second current terminal of the fourth transistor is coupled to a fourth mixer output, and wherein a control terminal of the fourth transistor is coupled to the second current terminal of the third transistor via a fourth capacitor.

6. A system, comprising:
a Zero IF transmitter having:
a mixer having inputs and outputs;
an intermediate stage having inputs and an output, wherein the inputs of the intermediate stage are coupled to the outputs of the mixer; and
a programmable gain stage having an input and an ouptut wherein the input of the programmable gain stage is coupled to the ouptut of the intermediate stage;
wherein the intermediate stage is configured to prevent dependency of I-Q mismatch and local oscillator leakage on the programmable gain stage.

7. A Zero IF transmitter circuit, comprising:
a mixer having inputs and outputs;
an intermediate stage having inputs and an ouput, wherein the inputs of the intermediate stage are coupled to the outputs of the mixer; and
a programmable gain stage having an input and an output wherein the input of the programmable gain stage is coupled to the output of the intermediate stage;
wherein the intermediate stage comprises a noise reduction circuit coupled to the mixer outputs; and
wherein the noise reduction circuit comprises an inductor for each intermediate stage input; wherein each inductor is coupled between the decoupling circuit and a ground node.

8. A Zero IF transmitter circuit, comprising:
a mixer having inputs and outputs;
an intermediate stage having inputs and an output, wherein the inputs of the intermediate stage are coupled to the outputs of the mixer; and
a programmable gain stage having an input and an output wherein the input of the programmable gain stage is coupled to the output of the intermediate stage;
wherein the decoupling circuit has a common gate structure.

9. A Zero IF transmitter circuit, comprising:
a mixer having inputs and outputs;
an intermediate stage having inputs and an output, wherein the inputs of the intermediate stage are coupled to the outputs of the mixer; and
a programmable gain stage haivng an input and an output wherein the input of the programmable gain stage is coupled to the output of the intermediate stage;
wherein the intermediate stage comprises a decoupling circuit;
wherein the intermediate stage comprises:
a first decoupling circuit coupled to a first set of intermediate stage inputs; and
a second decoupling circuit coupled to a second set of intermediate stage inputs.

10. The Zero IF transmitter circuit of claim 9, wherein the first decoupling circuit comprises:
a first transistor; and
a second transistor, wherein a first current terminal of the first transistor is coupled to the output of the intermediate stage, wherein a second current terminal of the first transistor is coupled to a first mixer output, and wherein a control terminal of the first transistor is coupled to the second current terminal of the second transistor via a first capacitor, and wherein a first current terminal of the second transistor is coupled to the output of the intermediate stage, wherein a second current terminal of the second transistor is coupled to a second mixer output, and wherein a control terminal of the second transistor is coupled to the second current terminal of the first transistor via a second capacitor.

11. The Zero IF transmitter circuit of claim 10, wherein the second decoupling circuit comprises:
a third transistor; and
a fourth transistor, wherein a first current terminal of the third transistor is coupled to the output of the intermediate stage, wherein a second current terminal of the third transistor is coupled to a third mixer output, and wherein a control terminal of the third transistor is coupled to the second current terminal of the fourth transistor via a third capacitor, and wherein a first current terminal of the fourth transistor is coupled to the output of the intermediate stage, wherein a second current terminal of the fourth transistor is coupled to a fourth mixer output, and wherein a control terminal of the fourth transistor is coupled to the second current terminal of the third transistor via a fourth capacitor.

12. A Zero IF transmitter circuit, comprising:
a mixer having inputs and outputs;
an intermediate stage having inputs and an output, wherein the inputs of the intermediate stage are coupled to the outputs of the mixer; and
a programmable gain stage having an input and an output wherein the input of the programmable gain stage is coupled to the output of the intermediate stage;
wherein the intermediate stage comprises a decoupling circuit having:
a first transistor; and
a second transistor, wherein a first current terminal of the first transistor is coupled to the output of the intermediate stage, wherein a second current terminal of the first transistor is coupled to a first mixer output, and wherein a control terminal of the first transistor is coupled to the second current terminal of the second transistor via a first capacitor, and wherein a first current terminal of the second transistor is coupled to the output of the intermediate stage, wherein a second current terminal of the second transistor is coupled to a second mixer output, and wherein a control terminal of the second transistor is coupled to the second current terminal of the first transistor via a second capacitor.

13. The Zero IF transmitter circuit of claim 12, further comprising:
   a first inductor coupled between the second current terminal of the first transistor and a ground node; and
   a second inductor coupled between the second current terminal of the second transistor and the ground node.

* * * * *